(12) United States Patent
Hatem et al.

(10) Patent No.: US 7,807,961 B2
(45) Date of Patent: Oct. 5, 2010

(54) TECHNIQUES FOR ION IMPLANTATION OF MOLECULAR IONS

(75) Inventors: Christopher R. Hatem, Salisbury, MA (US); Christopher A. Rowland, Rockport, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 133 days.

(21) Appl. No.: 12/247,544

(22) Filed: Oct. 8, 2008

(65) Prior Publication Data
US 2010/0084577 A1    Apr. 8, 2010

(51) Int. Cl.
*H01J 37/317* (2006.01)
*H01J 37/08* (2006.01)
*H01L 21/265* (2006.01)

(52) U.S. Cl. .............. 250/251; 250/492.21; 250/423 R; 250/424; 250/492.2; 250/492.3; 118/723 FI; 315/111.81; 438/514

(58) Field of Classification Search ................. 250/251, 250/492.21, 423 R, 424, 492.2, 492.3; 315/111.81; 118/723 FI; 438/514
See application file for complete search history.

(56) References Cited

U.S. PATENT DOCUMENTS

| 4,103,042 | A | 7/1978 | Winters |
| 7,459,704 | B2* | 12/2008 | Olson et al. ............ 250/492.21 |
| 2007/0148888 | A1* | 6/2007 | Krull et al. .................. 438/306 |
| 2007/0175587 | A1 | 8/2007 | Saito et al. |
| 2008/0087219 | A1* | 4/2008 | Horsky ....................... 118/698 |
| 2008/0299749 | A1* | 12/2008 | Jacobson et al. ............ 438/513 |
| 2009/0200494 | A1* | 8/2009 | Hatem et al. ........... 250/492.21 |

OTHER PUBLICATIONS

Arno, J. "Report on in-Situ Antimony Fluoride Generation for Ion Implant Processes", IEEE 14$^{th}$ International Conference on Ion Implantation Technology Proceedings, Sep. 2002.

Josep Arno, "Report on in-Situ antimony fluoride generation for ion implant processes," 14th International Conference on Ion Implantation Technology Proceedings, 2002, 0-7803-7155-0, pp. 452-454, IEEE.

* cited by examiner

*Primary Examiner*—Nikita Wells

(57) ABSTRACT

Techniques for ion implantation of molecular ions are disclosed. In one particular exemplary embodiment, the techniques may be realized as an apparatus for ion implantation comprising an ion implanter for implanting a target material with a molecular ion at a predetermined temperature to improve at least one of strain and amorphization of the target material, wherein the molecular ion is generated in-situ within an ion source.

17 Claims, 3 Drawing Sheets

TECHNIQUES FOR ION IMPLANTATION OF MOLECULAR IONS

FIELD OF THE DISCLOSURE

The present disclosure relates generally to ion implantation and, more particularly, to techniques for ion implantation of molecular ions.

BACKGROUND OF THE DISCLOSURE

Ion implantation is a process of depositing chemical species into a substrate by direct bombardment of the substrate with energized ions. In semiconductor manufacturing, ion implanters are used primarily for doping processes that alter a type and level of conductivity of target materials. A precise doping profile in an integrated circuit (IC) substrate and its thin-film structure is often crucial for proper IC performance. To achieve a desired doping profile, one or more ion species may be implanted in different doses and at different energy levels.

Moreover, ion implantation is currently the most common technique for introducing conductivity-altering impurities into semiconductor wafers. During such ion implantation, a desired impurity material is ionized in an ion source, generated ions are accelerated to form an ion beam of a prescribed energy, and the ion beam is directed at a surface of a semiconductor wafer. Energetic ions in the ion beam penetrate into semiconductor material in the semiconductor wafer and are embedded into a crystalline lattice of the semiconductor material to form a region of desired conductivity.

In the ion source, a gas or a solid material is typically converted into the ion beam. The ion beam is typically mass analyzed to eliminate undesired ion species, accelerated to a desired energy, and directed at the semiconductor wafer surface. The ion beam may be distributed over a semiconductor wafer surface area by beam scanning, by wafer movement, or by a combination of beam scanning and wafer movement. The ion beam may be a spot beam or a ribbon beam having long and short dimensions.

Carbon may be used as a co-implant species in association with another pre-amorphization implant (PAI) species, such as germanium, boron, etc. The idea is to position the carbon between a shallow dopant and end-of-range (EOR) damage caused by the PAI species. Substitutional carbon may block some interstitials coming back from EOR during an anneal process that may otherwise cause transient enhanced diffusion (TED) and boron interstitial cluster (BIC) formation. However, the position of carbon often overlaps with that of the PAI species, and so the carbon implant itself may contribute to PAI. Thus, carbon itself may also be used as a PAI species.

Carbon may also be used to create localized compressive strain. Therefore, if a source/drain in a transistor device is created from silicon carbon (SiC), carbon implantation may cause tensile strain in a channel of the transistor device. Incorporating carbon into a silicon lattice of the transistor device may require an epitaxial growth or a high implantation dose of carbon into the silicon lattice may cause amorphization. Also, carbon, in regrowth, may be incorporated into the silicon lattice and cause amorphization. As a result, amorphization and stress are both important factors considered by semiconductor manufacturers.

Accordingly, in view of the foregoing, it may be understood that there are significant problems and shortcomings associated with current technologies for ion implantation, and more particularly, for implanting molecular ions.

SUMMARY OF THE DISCLOSURE

Techniques for ion implantation of molecular ions are disclosed. In one particular exemplary embodiment, the techniques may be realized as an apparatus for ion implantation comprising an ion implanter for implanting a target material with a molecular ion at a predetermined temperature to improve at least one of strain and amorphization of the target material, wherein the molecular ion may be generated in-situ within an ion source.

In accordance with other aspects of this particular exemplary embodiment, the molecular ion may be generated using two or more species.

In accordance with further aspects of this particular exemplary embodiment, the molecular ion may be a $C_a P_b H_c$ molecular ion.

In accordance with additional aspects of this particular exemplary embodiment, the molecular ion may be generated by using a carbon-containing species and a phosphorus-containing species.

In accordance with other aspects of this particular exemplary embodiment, the carbon-containing species may be ethane and/or at least one of molecular carbon, an alkane, and an alkene.

In accordance with further aspects of this particular exemplary embodiment, wherein the phosphorus-containing species may be phosphine.

In accordance with additional aspects of this particular exemplary embodiment, implanting the target material may create strain and fabricates an ultra-shallow junction (USJ) in the target material.

In accordance with other aspects of this particular exemplary embodiment, the ion implanter may further control at least one of dose, dose rate, number of atoms in the carbon-containing species, atomic energy, pressure, and the predetermined temperature to further improve at least one of strain and amorphization.

In another particular exemplary embodiment, the techniques may be realized as a method for ion implantation comprising an ion implanter for implanting a target material with a molecular ion at a predetermined temperature to improve at least one of strain and amorphization of the target material, wherein the molecular ion may be generated in-situ within an ion source In yet another particular exemplary embodiment, the techniques may be realized as an apparatus for ion implantation comprising an ion implanter for implanting a target material with a molecular ion at a predetermined temperature to improve at least one of strain and amorphization of the target material, wherein the molecular ion is generated in-situ within an ion source using a carbon-containing species and a phosphorus-containing species.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

Embodiments of the present disclosure provide techniques for ion implantation of molecular ions.

As part of, or in association with such techniques, molecular ions may be implanted into a workpiece, such as, for example, a semiconductor wafer. Formulae of these molecular ions may vary widely. Accordingly, in formulae presented in the present disclosure, C represents carbon, B represents boron, H represents hydrogen, P represents phosphorus, and Si represents silicon. In some embodiments, the formulae may be represented by $C_a X_b Y_c$, where a>0, b>0 and c>0. In this example, $C_a X_b Y_c$ may represent a molecular ion. In other embodiments, X and Y may be used to represent at least one element. For instance, in some cases, X and/or Y may represent single elements (e.g., X=P, Y=H); and, in other cases, X and/or Y may represent more than one element (e.g., X=$NH_4$, $NH_3$, $CH_3$). Also, it should be appreciated, for example, that a formula such as CXY may be represented by other equivalent chemical formulas that may include the same elements in a different order such as XCY or CYX.

In some situations, Y may represent at least hydrogen (e.g., the formula comprises $C_a X_b H_c$). In other situations, X may represent at least phosphorus (e.g., the formula comprises $C_a P_b Y_c$). It should be appreciated that, in yet other embodiments, derivatives of $C_a X_b Y_c$ may be used which contain other elements or groups of elements at the C, X, and/or Y sites. It should also be appreciated that substituents may be any suitable inorganic or organic species.

Although the formula $C_a P_b H_c$ may be used in one embodiment, other various embodiments may also be provided. For example, it should be appreciated that the molecular atoms/ions may not be limited solely to molecules with the formulas CBY or XBY. For example, the molecular atoms/ions may be carbon-containing species, such as decaborane or octadecaborane. Other carbon-containing species may include an alkane such as methane, ethane, propane, or butane, or a pyrene. Other various embodiments may also be provided.

Figure 1:
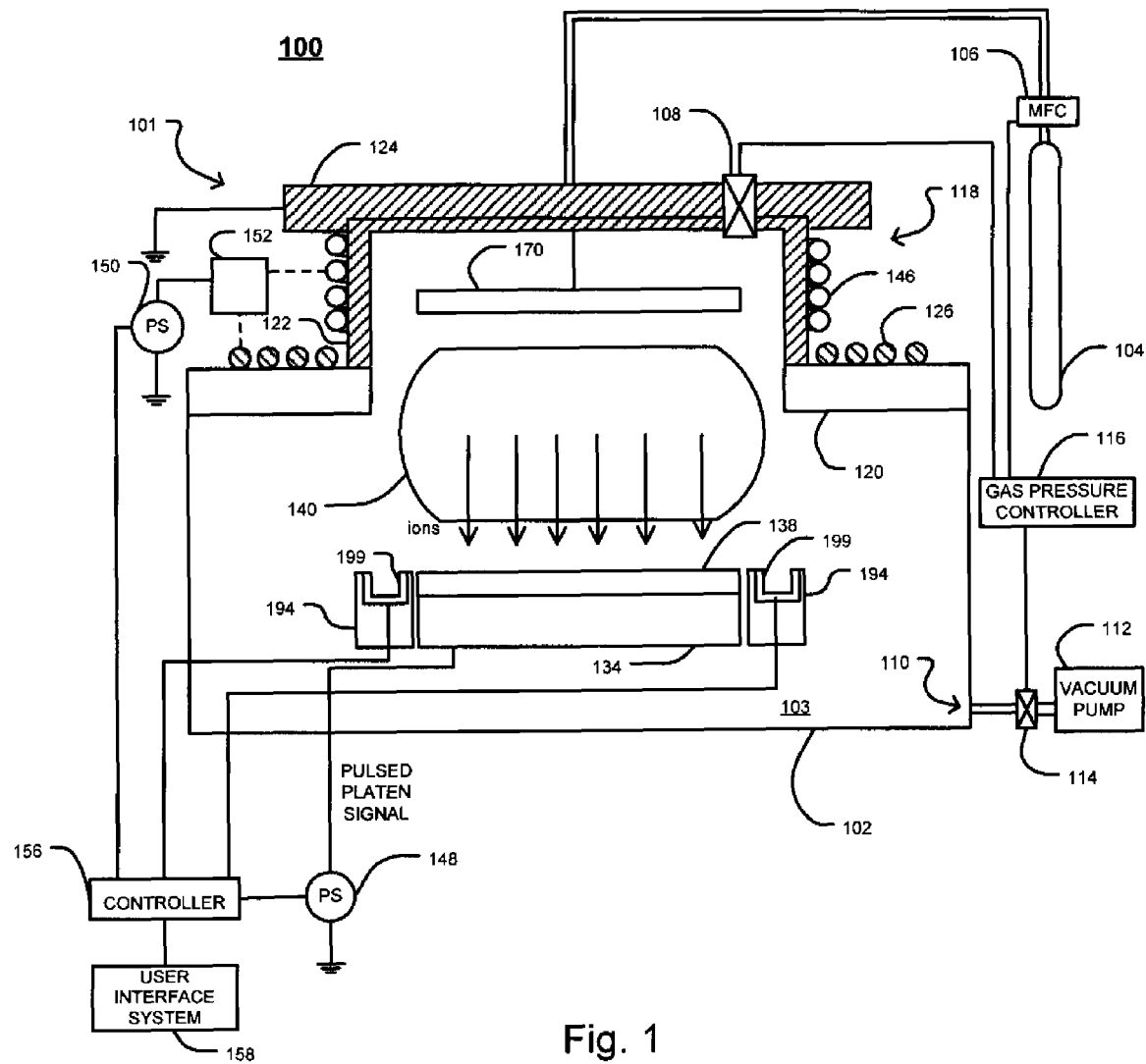
FIG. 1 depicts a partial cross-sectional view of a plasma doping system according to an embodiment of the present disclosure.

FIG. 1 depicts a plasma doping system 100 according to an embodiment of the present disclosure. Referring to FIG. 1, the plasma doping system 100 may comprise a process chamber 102 defining an enclosed volume 103. A platen 134 may be positioned in the process chamber 102 to support a workpiece 138. In one embodiment, the workpiece 138 may be a semiconductor wafer having a disk shape. For example, a 300 millimeter (mm) diameter silicon wafer may be used. In another embodiment, the workpiece 138 may be clamped to a flat surface of the platen 134 by electrostatic or mechanical forces. In yet another embodiment, the platen 134 may include conductive pins (not shown) for forming a connection to the workpiece 138. Other various embodiments may also be provided.

The plasma doping system 100 may also comprise a gas source 104 to provide a dopant gas to the enclosed volume 103 through a mass flow controller 106. A gas baffle 170 may be positioned in the process chamber 102 to deflect a flow of gas from the gas source 104. A pressure gauge 108 be provided to measure a pressure inside the process chamber 102. A vacuum pump 112 may be utilized to evacuate exhaust from the process chamber 102 through an exhaust port 110 in the process chamber 102. An exhaust valve 114 may control exhaust conductance through the exhaust port 110.

The plasma doping system 100 may further comprise a gas pressure controller 116 that may be electrically connected to the mass flow controller 106, the pressure gauge 108, and the exhaust valve 114. The gas pressure controller 116 may be configured to maintain a desired pressure in the process chamber 102 by controlling either exhaust conductance with the exhaust valve 114 or a process gas flow rate with the mass flow controller 106 in a feedback loop that is responsive to the pressure gauge 108.

The process chamber 102 may have a chamber top 118 comprising a first section 120 formed of a dielectric material that extends in a generally horizontal direction. The chamber top 118 may also comprise a second section 122 formed of a dielectric material that extends a height from the first section 120 in a generally vertical direction. The chamber top 118 may further comprise a lid 124 formed of an electrically and thermally conductive material that extends across the second section 122 in a horizontal direction. The lid 124 may also be grounded.

The plasma doping system 100 may further include a source configuration 101 configured to generate a plasma 140 within the process chamber 102. The source configuration 101 may comprise an RF source 150, such as a power supply, to supply RF power to either one or both of a planar RF antenna 126 and a helical RF antenna 146 to generate the plasma 140. The RF source 150 may be coupled to the antennas 126, 146 through an impedance matching network 152. In one embodiment, the impedance matching network 152 may match the output impedance of the RF source 150 to the impedance of the RF antennas 126, 146 in order to maximize the power provided to the RF antennas 126, 146 from the RF source 150. Other various configurations may also be provided.

The plasma doping system 100 may also comprise a bias power supply 148 electrically coupled to the platen 134. In one embodiment, the bias power supply 148 may be configured to provide a pulsed platen signal having pulse ON and OFF time periods to bias the platen 134, and, hence, the workpiece 138, so as to accelerate ions from the plasma 140 toward the workpiece 138 during the pulse ON time periods, but not during the pulse OFF periods. The bias power supply 148 may be a DC or an RF power supply. Other variations may also be utilized.

The plasma doping system 100 may further comprise a shield ring 194 disposed around the platen 134. The shield ring 194 may be biased to improve uniformity of ion implantation distribution near an edge of the workpiece 138. One or more Faraday sensors, such as an annular Faraday sensor 199, may be positioned in the shield ring 194 to sense ion beam current.

The plasma doping system 100 may further comprise a controller 156 and a user interface system 158. In one embodiment, the controller 156 may be a general-purpose computer or a network of general-purpose computers that are programmed to perform desired input/output functions. In another embodiment, the controller 156 may include or also include other electronic circuitry or components, such as application-specific integrated circuits, other hardwired or programmable electronic devices, discrete element circuits, etc. In yet another embodiment, the controller 156 may include or also include communication devices, data storage devices, and software. It should be appreciated that while the controller 156 of FIG. 1 is illustrated as providing output signals to the power supplies 148, 150, and receiving input signals from the Faraday sensor 199, the controller 156 may also provide output signals to and receive input signals from other components of the plasma doping system 100. Other various embodiments may also be provided.

The user interface system 158 may comprise various devices to allow a user to input commands and/or data and/or to monitor the plasma doping system 100 via the controller 156. These may include touch screens, keyboards, user pointing devices, displays, printers, etc. Other various devices may also be utilized.

In operation, the gas source 104 may supply a primary dopant gas containing a desired dopant for implantation into the workpiece 138. A variety of a primary dopant gases may be used. For example, in one embodiment, the primary dopant gas may be Si, C, N, Ge, Sn, Al, Mg, Ag, Au, or combinations thereof. In another embodiment, the primary dopant gas may also be, or may also include, arsenic, boron, phosphorus, carborane $C_2B_{10}H_{12}$, or other large molecular compounds. In yet another embodiment, the primary dopant gas may be an alkane or another atomic or molecular carbon-containing species. Other various primary dopant gas embodiments may also be provided.

The gas pressure controller 116 may regulate the rate at which the primary dopant gas is supplied to the process chamber 102. The source configuration 101 may operate to generate the plasma 140 within the process chamber 102. The source configuration 101 may be controlled by the controller 156. To generate the plasma 140, the RF source 150 may resonate RF currents in at least one of the RF antennas 126, 146 to produce an electromagnetic field (e.g., an oscillating, a DC, or an RF field) in the process chamber 102, which in turn may excite and ionize the primary dopant gas in the process chamber 102 to generate the plasma 140.

The bias power supply 148 may provide a pulsed platen signal to bias the platen 134 and, hence, the workpiece 138 to accelerate ions from the plasma 140 toward the workpiece 138 during the pulse ON periods of the pulsed platen signal. A frequency and/or duty cycle of the pulsed platen signal may be selected to provide a desired dose rate. An amplitude of the pulsed platen signal may be selected to provide a desired energy. With all other parameters being equal, a greater energy will result in a greater implanted depth.

Figure 2:
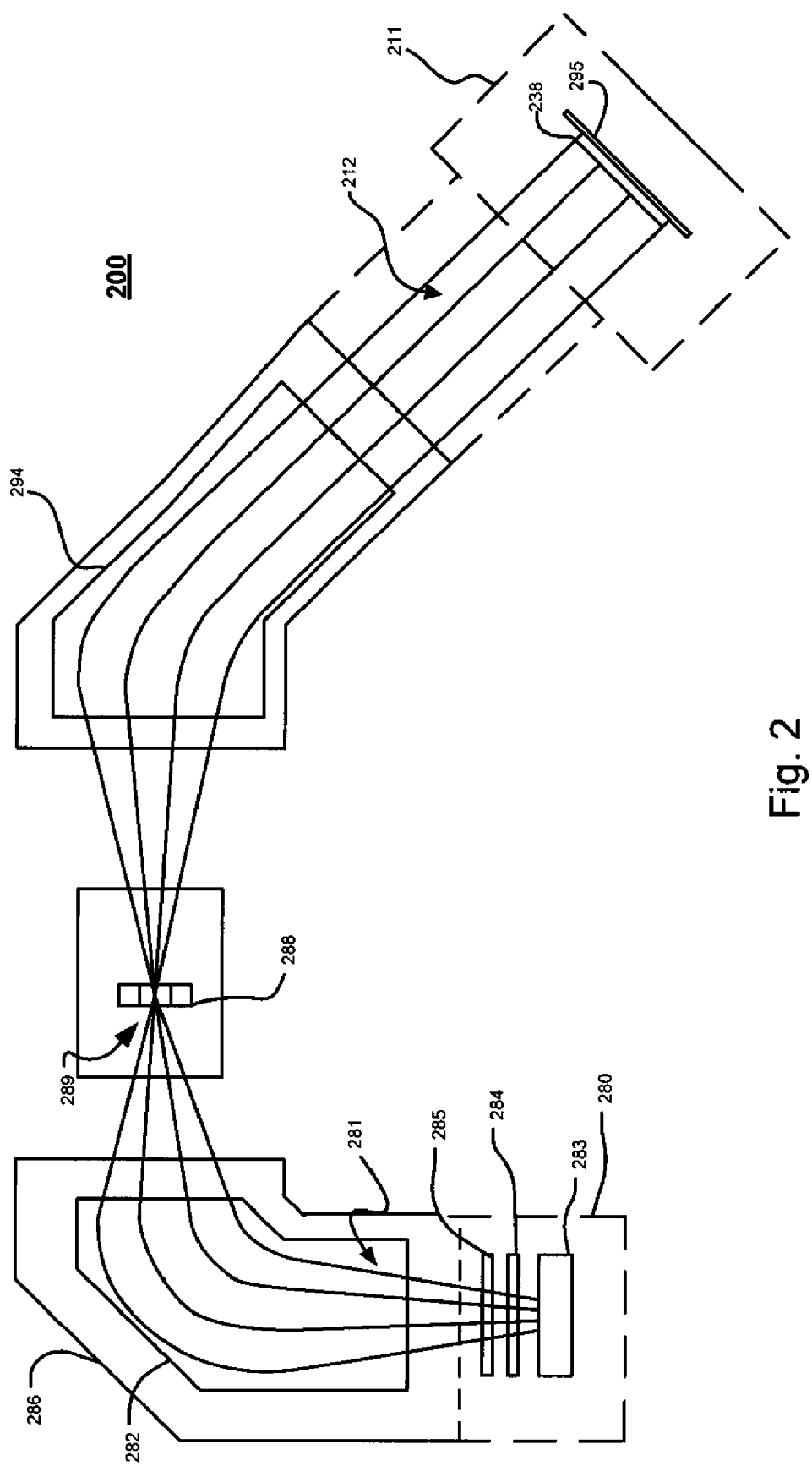
FIG. 2 depicts a beam-line ion implanter according to an embodiment of the present disclosure.

FIG. 2 depicts a beam-line ion implanter 200 according to an embodiment of the present disclosure. Referring to FIG. 2, the beam-line ion implanter 200 may comprise an ion source 280 to generate ions that form an ion beam 281. The ion source 280 may comprise an ion chamber 283 and a gas box (not shown) containing a gas to be ionized. The gas may be supplied to the ion chamber 283 where it is ionized. In one embodiment, the gas may be or may include arsenic, boron, phosphorus, carborane $C_2B_{10}H_{12}$, or other molecular compounds. In another embodiment, the gas may be an alkane or other atomic or molecular carbon-containing species. The ions that are generated in the ion chamber 283 may be extracted from the ion chamber 283 to form the ion beam 281.

The ion beam 281 may be directed between the poles of a resolving magnet 282. A power supply may be connected to an extraction electrode (not shown) of the ion source 280 and may provide an adjustable voltage. For example, a voltage of approximately 0.2 to 80 kV in a high current ion implanter may be provided. Thus, singly charged ions from the ion source 280 may be accelerated to energies of about 0.2 to 80 keV by this adjustable voltage.

The ion beam 281 may pass through a suppression electrode 284 and a ground electrode 285 to a mass analyzer 286. As depicted in FIG. 2, the mass analyzer 286 may comprise the resolving magnet 282. The mass analyzer 286 may direct the ion beam 281 to a masking electrode 288 having a resolving aperture 289. In another embodiment, the mass analyzer 286 may include the resolving magnet 282 and the masking electrode 288 having the resolving aperture 289. The resolving magnet 282 may deflect ions in the ion beam 281 such that ions of a desired ion species may pass through the resolving aperture 289 and ions of an undesired ion species may not pass through the resolving aperture 289. Instead, such undesired ion species may be blocked by the masking electrode 288. In one embodiment, for example, the resolving magnet 282 may deflect ions of the desired species by about 90°.

Ions of the desired ion species may pass through the resolving aperture 289 to an angle corrector magnet 294. The angle corrector magnet 294 may then deflect ions of the desired ion species and convert the ion beam from a diverging ion beam into ribbon ion beam 212 containing ions which may have substantially parallel trajectories. In one embodiment, for example, the angle corrector magnet 294 may deflect ions of the desired ion species by about 70°.

In another embodiment, the beam-line ion implanter 200 may also include acceleration or deceleration units. Other various embodiments may also be provided.

An end station 211 may support one or more workpieces, such as workpiece 238, in the path of the ribbon ion beam 212 such that ions of the desired species may be implanted into workpiece 138. The end station 211 may comprise a platen 295 to support the workpiece 238. The end station 211 also may comprise a scanner (not shown) for moving the workpiece 238 perpendicular to a long dimension of a cross-section of the ribbon ion beam 212, thereby distributing ions over the entire surface of workpiece 238. It should be appreciated that although the ribbon ion beam 212 is depicted in FIG. 2, other various beam configurations may be provided, such as, for example, a spot beam.

The ion implanter 200 may comprise additional components. For example, in one embodiment, the end station 211 may also comprise automated workpiece handling equipment for introducing workpieces into the beam-line ion implanter 200 and for removing workpieces after ion implantation. In another embodiment, the end station 211 may also comprise a dose measuring system, an electron flood gun, or other similar components. It should be appreciated that the entire path traversed by the ion beam 212 may also be evacuated during ion implantation. Furthermore, it should be appreciated that the beam-line ion implanter 200 may also provide for hot or cold implantation of ions.

Embodiments of the present disclosure may provide formation of tailored types of molecules. For example, in-situ generation of tailored molecules may be formed in an ion source. Such generation of tailored molecular atoms/ions (e.g., $C_aP_bH_c$) for implantation may increase amorphization of a workpiece. Furthermore, use of such molecular species may increase an amount of carbon that is implanted at a given beam energy due to a number of carbon atoms per molecule.

In at least some of the embodiments of the present disclosure, ion implantation techniques may be provided to improve amorphization caused by implanting in generated molecular ions. There are numerous parameters that may be adjusted to improve amorphization. First, for example, increasing an ion implantation dose may cause an amorphous/crystalline interface of a workpiece to become deeper, thereby improving amorphization. However, such amorphization may be limited because gate-induced diode leakage (GIDL) may tend to be associated with carbon.

Second, an ion implantation dose rate may also be increased to improve amorphization because such an increase may also cause an amorphous/crystalline interface of a workpiece to become deeper. However, this effect may be limited by the ability of an ion source to produce beam currents.

Third, increasing a number of atoms in a molecule may amorphize a workpiece more rapidly and more deeply as well. As such, this may have a similar effect to changing ion implantation dose rate.

Molecules may also share total energy among constituent atoms according to their respective masses. For instance, in deep implants, atoms may have high energy and this high energy may be limited by an ability of magnets in an ion implanter to bend an ion beam or may be limited by acceleration voltages that are available.

Fourth, amorphization may be improved by decreasing temperature of a workpiece. Although heavier species, such as germanium, temperature effects may be smaller, decreasing temperature may ultimately produce deeper amorphization and a smoother amorphous/crystalline interface. Ultimately, this may lead to reduced damage after regrowth, such as solid phase epitaxial regrowth (SPER).

It should be appreciated that ethane ($C_2H_6$), for exemplary purposes, may be used to take advantage of many of the above-described methods to improve amorphization. For example, ethane may be produced in a standard ion source (e.g., an indirectly heated cathode (IHC)) with simple precursors (e.g., ethane, propane, etc.). In some embodiments, cold temperatures may be used to improve amorphization with ethane. In other embodiments, flowing phosphine ($PH_3$) or other similar species into a standard ion source may help provide in-situ generation of molecular ions, such as $C_aP_bH_c$. Such generation and implantation of $C_aP_bH_c$ molecular ions may increase productivity of ion implantation by improving amorphization and strain formation. Although embodiments are directed to use of ethane and phosphine, other carbon-containing species similar to ethane and/or other phosphorus-containing species similar to phosphine may also be used.

As discussed above, carbon-containing species and phosphorus-containing species may be used in semiconductor manufacture. More specifically, benefits of in-situ generation of molecular atoms (e.g., $C_aP_bH_c$ molecular ions) using carbon-containing species (e.g., ethane) and phosphorus-containing species (e.g., phosphine) may be readily apparent in the manufacture of complementary metal-oxide-semiconductor (CMOS) devices for both ultra-shallow junction (USJ) and Si—C strain formation. For example, $C_aP_bH_c$ molecular ions may increase the efficiency of carbon atoms to displace silicon atoms from a crystal lattice surface of a workpiece upon impact with the surface. This may further increase the efficiency of $C_aP_bH_c$ molecular ion to result in substitutional carbon which may create strain and its ability to self-amorphize.

In the manufacture of n-type metal-oxide-semiconductor (NMOS) devices, Si—C formation may be followed by a phosphorus, arsenic, or other similar implant. Furthermore, NMOS source/drain extensions (SDEs) may incorporate carbon and phosphorus as an active dopant. In such cases, carbon may hinder dopant diffusion and phosphorus may be an active dopant. Thus, by flowing ethane and phosphine, for example, into an IHC, $C_aP_bH_c$ molecular ions may be created and ionized in-situ within the chamber 183, 283.

Figure 3:
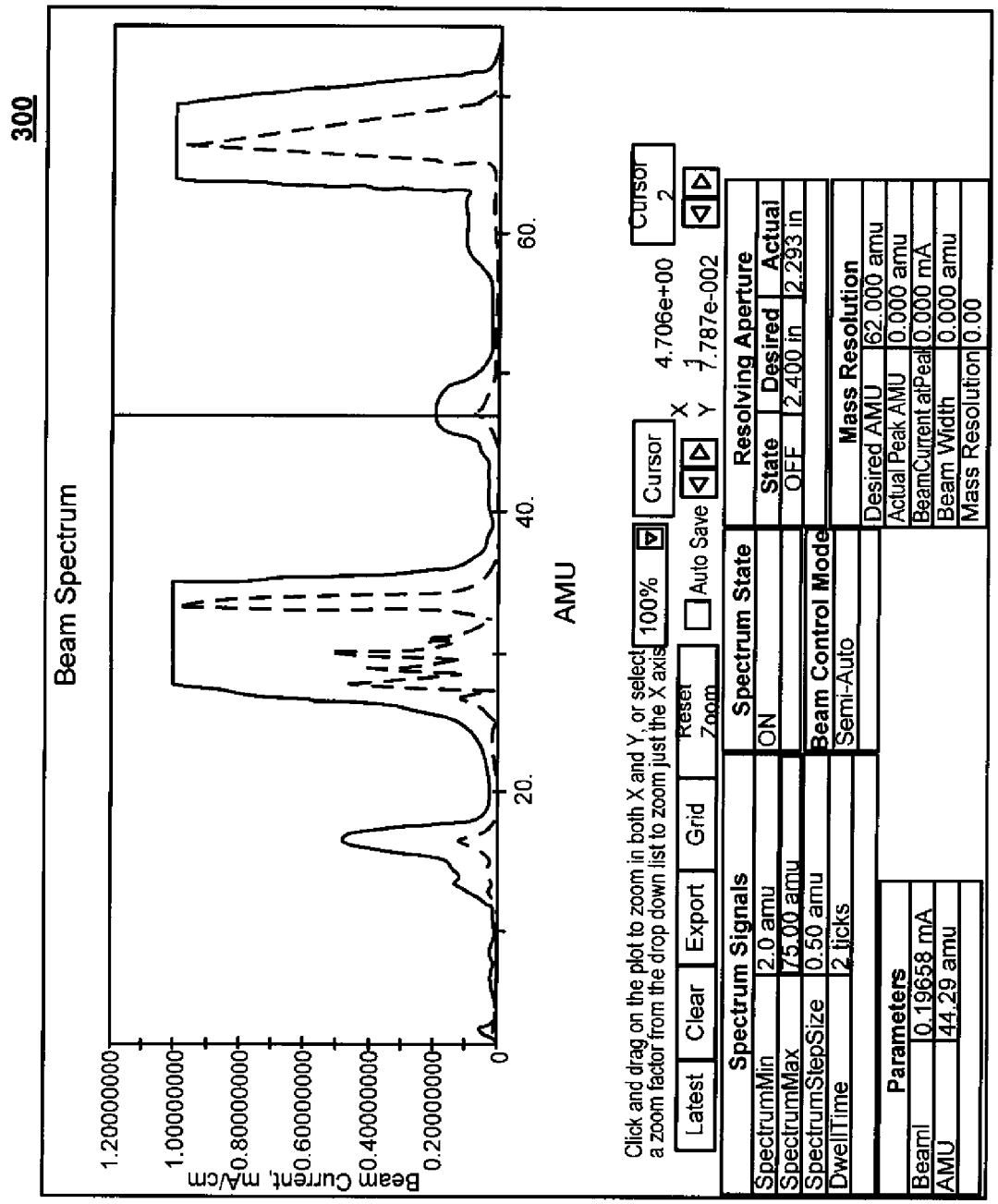
FIG. 3 depicts an exemplary graph illustrating the effect of ion implantation using molecular ions according to an embodiment of the present disclosure.

FIG. 3 depicts an exemplary graph 300 illustrating effects of ion implantation using molecular ions generated in-situ using carbon-containing species and phosphorous-containing species according to an embodiment of the present disclosure. Specifically, in FIG. 3, the use of ethane as a carbon-containing species and phosphine as a phosphorus-containing species is shown to form $C_aP_bH_c$ molecular ions within the ion source, which may increase amorphization and create a substantially abrupt profile ideal for ion implantation, as described above.

Accordingly, an implant of $C_aP_bH_c$ molecular ion generated in-situ by flowing various species (e.g., a carbon-containing species and a phosphorus-containing species) may provide a template for generating tailored molecules useful for ion implantation. For example, by in-situ generation of such molecules, a more efficient model for ion implantation may be provided. For instance, in-situ generation reduces a number of steps in ion implantation. In addition, additional benefits may arise from combining non-traditional species, as well as combining other various techniques to enhance overall ion implantation.

For example, an implant of $C_aP_bH_c$ molecular ion generated in-situ by flowing a carbon-containing species and a phosphorus-containing species may improve both ultra-shallow implants and strain engineering. In addition, an implant of $C_aP_bH_c$ molecular ion may be performed to fabricate an ultra-shallow junction (USJ). To implant a USJ, a workpiece may be amorphized so that dopants (e.g., boron, phosphorus, etc.) do not channel within a crystal lattice of the workpiece. Carbon may be implanted to create an amorphous layer. For instance, flowing a carbon-containing species and a phosphorus-containing species may allow in-situ generation of $C_aP_bH_c$ molecular ions to provide better activation of boron or phosphorus. These species may make a dopant profile shallower and also prevent channeling within a crystal lattice of a workpiece. Specifically, carbon may compete with boron or phosphorus for activation sites and may therefore inhibit diffusion of boron or phosphorus. It should be appreciated that while only one example is described, other ultra-shallow implants may be performed in a similar manner by implantation of $C_aP_bH_c$ molecular ions.

Furthermore, an implant of molecular ions (e.g., $C_aP_bH_c$ molecular ions) may be performed to create strain. Carbon that is implanted into a workpiece to create strain may knock atoms out of a crystal lattice of the workpiece. For example, silicon or germanium atoms may be knocked out of such a crystal lattice. If the carbon-containing species is a molecular compound with multiple carbon atoms, then there may be an increased chance that the carbon atoms may knock out an atom from the crystal lattice of the workpiece. Thus, introducing a carbon-containing species and a phosphorus-containing species to generate $C_aP_bH_c$ molecular ions may increase amorphization and strain.

Accordingly, implantation of $C_aP_bH_c$ molecular ions under the conditions described above may substantially improve the effects of amorphization and strain and optimize ion implantation, particularly in fabricating a USJ.

It should also be appreciated that while embodiments of the present disclosure are directed towards implantation using a plasma doping system operating in an RF mode, other implementations, systems, and/or modes of operation may also be provided. For example, these may include other plasmabased ion implantation systems, such as glow discharge plasma doping (GD-PLAD) or other ion implantation systems.

It should also be appreciated that while embodiments of the present disclosure are directed towards in-situ generation of molecular ions (e.g., $C_aP_bH_c$ molecular ions) at an ion source, generation of molecular ions may occur outside of the ion source as well. Other various embodiments may also be provided.

It should also be appreciated that while embodiments of the present disclosure are described using carbon-containing species and phosphorus-containing species to generate the molecular ions, other similar implantation species may also be provided.

It should further be appreciated that the disclosed embodiments not only provide several modes of operation, but that these various modes may provide additional implantation customizations that would not otherwise be readily provided.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A method for ion implantation, the method comprising: implanting a target material with a molecular ion at a predetermined temperature to improve at least one of strain and amorphization of the target material, wherein the molecular ion is generated in-situ within an ion source from two or more species.

2. The method of claim 1, wherein the molecular ion is a $C_aP_bH_c$ molecular ion.

3. The method of claim 1, wherein the molecular ion is generated by using a carbon-containing species and a phosphorus-containing species.

4. The method of claim 3, wherein the carbon-containing species is ethane.

5. The method of claim 3, wherein the carbon-containing species is at least one of molecular carbon, an alkane, and an alkene.

6. The method of claim 3, wherein the phosphorus-containing species is phosphine.

7. The method of claim 1, wherein implanting the target material creates strain and fabricates an ultra-shallow junction (USJ) in the target material.

8. The method of claim 1, further comprising controlling at least one of dose, dose rate, number of atoms in the two or more species, atomic energy, pressure, and the predetermined temperature to further improve at least one of strain and amorphization.

9. An apparatus for ion implantation, the apparatus comprising:
an ion implanter for implanting a target material with a molecular ion at a predetermined temperature to improve at least one of strain and amorphization of the target material, wherein the molecular ion is generated in-situ within an ion source from two or more species.

10. The apparatus of claim 9, wherein the molecular ion is a $C_aP_bH_c$ molecular ion.

11. The apparatus of claim 1, wherein the molecular ion is generated by using a carbon-containing species and a phosphorus-containing species.

12. The apparatus of claim 11, wherein the carbon-containing species is ethane.

13. The apparatus of claim 11, wherein the carbon-containing species is at least one of molecular carbon, an alkane, and an alkene.

14. The apparatus of claim 11, wherein the phosphorus-containing species is phosphine.

15. The apparatus of claim 9, wherein implanting the target material creates strain and fabricates an ultra-shallow junction (USJ) in the target material.

16. The apparatus of claim 9, further comprising controlling at least one of dose, dose rate, number of atoms in the two or more species, atomic energy, pressure, and the predetermined temperature to further improve at least one of strain and amorphization.

17. An apparatus for ion implantation, the apparatus comprising:
an ion implanter for implanting a target material with a $C_aP_bH_c$ molecular ion at a predetermined temperature to improve at least one of strain and amorphization of the target material, wherein the $C_aP_bH_c$ molecular ion is generated in-situ within an ion source using a carbon-containing species and a phosphorus-containing species.

* * * * *

UNITED STATES PATENT AND TRADEMARK OFFICE
CERTIFICATE OF CORRECTION

| | |
|---|---|
| PATENT NO. | : 7,807,961 B2 |
| APPLICATION NO. | : 12/247544 |
| DATED | : October 5, 2010 |
| INVENTOR(S) | : Christopher R. Hatem et al. |

It is certified that error appears in the above-identified patent and that said Letters Patent is hereby corrected as shown below:

Col. 10, Line 23, Claim 11, "Claim 1" should read -- Claim 9 --.

Signed and Sealed this
Twenty-fourth Day of April, 2012

David J. Kappos
*Director of the United States Patent and Trademark Office*